United States Patent
Zhang et al.

(10) Patent No.: US 10,141,901 B2
(45) Date of Patent: Nov. 27, 2018

(54) FLIP-CHIP AMPLIFIER WITH TERMINATION CIRCUIT

(71) Applicant: Skyworks Solutions, Inc., Woburn, MA (US)

(72) Inventors: Guohao Zhang, Nanjing (CN); Hardik Bhupendra Modi, Irvine, CA (US); Jaydutt Jagdish Joshi, Irvine, CA (US); Bhuvaneshwaran Vijayakumar, Irvine, CA (US); Dinhphuoc Vu Hoang, Anaheim, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/262,377

(22) Filed: Sep. 12, 2016

(65) Prior Publication Data

US 2016/0380603 A1    Dec. 29, 2016

Related U.S. Application Data

(63) Continuation of application No. 13/673,612, filed on Nov. 9, 2012, now Pat. No. 9,467,940.

(Continued)

(51) Int. Cl.
*H03F 3/72* (2006.01)
*H01L 23/66* (2006.01)
(Continued)

(52) U.S. Cl.
CPC .............. *H03F 3/72* (2013.01); *H01L 23/66* (2013.01); *H01L 25/00* (2013.01); *H03F 1/0227* (2013.01);
(Continued)

(58) Field of Classification Search
CPC ................................. H03F 3/72; H01L 23/66
(Continued)

(56) References Cited

U.S. PATENT DOCUMENTS

| 5,300,895 A | 4/1994 | Jones |
| 5,347,229 A | 9/1994 | Suckling et al. |

(Continued)

FOREIGN PATENT DOCUMENTS

| CN | 1702959 A | 11/2005 |
| CN | 1914791 A | 2/2007 |

(Continued)

OTHER PUBLICATIONS

Ali et al, "Efficiency Enhancement of a Tunable RF Power Amplifier by Second Harmonic Manipulation using Thin-Film BST Varactor," Proceedings of Asia-Pacific Microwave Conference, 2010, pp. 434-436.

(Continued)

*Primary Examiner* — Patricia T Nguyen
(74) *Attorney, Agent, or Firm* — Knobbe, Martens, Olson & Bear, LLP

(57) ABSTRACT

Disclosed are devices and methods for improving power added efficiency and linearity of radio-frequency power amplifiers implemented in flip-chip configurations. In some embodiments, a harmonic termination circuit can be provided so as to be separate from an output matching network configured to provide impedance matching at a fundamental frequency. The harmonic termination circuit can be configured to terminate at a phase corresponding to a harmonic frequency of the power amplifier output. Such a configuration of separate fundamental matching network and harmonic termination circuit allows each to be tuned separately to thereby improve performance parameters such as power added efficiency and linearity.

21 Claims, 11 Drawing Sheets

Related U.S. Application Data

(60) Provisional application No. 61/558,866, filed on Nov. 11, 2011.

(51) Int. Cl.
| | | |
|---|---|---|
| H01L 25/00 | (2006.01) | |
| H03F 1/02 | (2006.01) | |
| H03F 1/56 | (2006.01) | |
| H03F 3/195 | (2006.01) | |
| H03F 3/21 | (2006.01) | |
| H03F 3/24 | (2006.01) | |
| H04B 1/04 | (2006.01) | |
| H04W 52/02 | (2009.01) | |

(52) U.S. Cl.
CPC ............ *H03F 1/0277* (2013.01); *H03F 1/56* (2013.01); *H03F 3/195* (2013.01); *H03F 3/211* (2013.01); *H03F 3/245* (2013.01); *H04B 1/0458* (2013.01); *H04W 52/02* (2013.01); *H01L 2223/6655* (2013.01); *H01L 2223/6677* (2013.01); *H01L 2224/16225* (2013.01); *H01L 2924/1305* (2013.01); *H01L 2924/19041* (2013.01); *H01L 2924/19105* (2013.01); *H03F 2200/222* (2013.01); *H03F 2200/318* (2013.01); *H03F 2200/387* (2013.01); *H03F 2200/411* (2013.01); *H03F 2200/429* (2013.01); *H03F 2203/7209* (2013.01); *H03F 2203/7221* (2013.01); *H03F 2203/7236* (2013.01)

(58) Field of Classification Search
USPC ....................................................... 330/307
See application file for complete search history.

(56) References Cited

U.S. PATENT DOCUMENTS

| | | | |
|---|---|---|---|
| 5,532,646 A | | 7/1996 | Aihara |
| 5,748,042 A | * | 5/1998 | Norris .................. H03F 1/3205 |
| | | | 330/149 |
| 6,046,641 A | * | 4/2000 | Chawla .................. H03F 1/565 |
| | | | 330/269 |
| 6,140,892 A | | 10/2000 | Uda et al. |
| 6,384,688 B1 | | 5/2002 | Fujioka et al. |
| 6,577,199 B2 | | 6/2003 | Dent |
| 6,750,546 B1 | | 6/2004 | Villanueva et al. |
| 7,202,736 B1 | | 4/2007 | Dow et al. |
| 7,265,618 B1 | | 9/2007 | Meck |
| 7,372,334 B2 | | 5/2008 | Blair et al. |
| 7,643,800 B2 | | 1/2010 | Rofougaran |
| 7,728,696 B2 | | 6/2010 | Stuebing et al. |
| 7,733,118 B2 | | 6/2010 | Hollis et al. |
| 7,733,187 B2 | | 6/2010 | Tateoka et al. |
| 7,791,210 B2 | | 9/2010 | Miller et al. |
| 7,848,286 B2 | | 12/2010 | Zhen et al. |
| 7,852,281 B2 | | 12/2010 | Choudhurry |
| 7,872,523 B2 | | 1/2011 | Sivakumar et al. |
| 7,899,006 B2 | | 3/2011 | Boyd |
| 7,928,804 B2 | | 4/2011 | Yamamoto et al. |
| 8,081,928 B2 | | 12/2011 | Kelly |
| 8,164,387 B1 | | 4/2012 | Apel et al. |
| 8,274,162 B2 | | 9/2012 | Monthei |
| 8,301,106 B2 | | 10/2012 | Misra |
| 8,611,834 B2 | | 12/2013 | Harris et al. |
| 8,797,103 B2 | | 8/2014 | Kaczman et al. |
| 8,983,406 B2 | | 3/2015 | Zhang et al. |
| 9,041,472 B2 | | 5/2015 | Chen et al. |
| 9,083,282 B2 | | 7/2015 | Zhang et al. |
| 9,231,533 B2 | | 1/2016 | Zhang et al. |
| 9,294,056 B2 | | 3/2016 | Nobbe et al. |
| 9,374,045 B2 | | 6/2016 | Zhang et al. |
| 9,392,409 B2 | | 7/2016 | Moir et al. |
| 9,467,940 B2 | | 10/2016 | Zhang et al. |
| 9,509,251 B2 | | 11/2016 | Jones |
| 2002/0171477 A1 | | 11/2002 | Nakayama |
| 2003/0085761 A1 | | 5/2003 | Okubo et al. |
| 2005/0104679 A1 | | 5/2005 | Blednov |
| 2005/0122164 A1 | | 6/2005 | Brandt et al. |
| 2006/0181351 A1 | | 8/2006 | Ripley |
| 2007/0024374 A1 | * | 2/2007 | Blair ....................... H01L 23/66 |
| | | | 330/302 |
| 2007/0057731 A1 | | 3/2007 | Le |
| 2007/0085754 A1 | | 4/2007 | Ella et al. |
| 2008/0039025 A1 | | 2/2008 | Ray et al. |
| 2009/0278610 A1 | | 11/2009 | Murji et al. |
| 2010/0060357 A1 | | 3/2010 | Drogi et al. |
| 2010/0164632 A1 | | 7/2010 | Blednov |
| 2010/0253435 A1 | | 10/2010 | Ichitsubo et al. |
| 2010/0291888 A1 | | 11/2010 | Hadjichristos et al. |
| 2011/0018632 A1 | | 1/2011 | Pletcher et al. |
| 2011/0133838 A1 | | 6/2011 | Paul et al. |
| 2011/0140772 A1 | | 6/2011 | Sengupta et al. |
| 2011/0195677 A1 | | 8/2011 | Misra |
| 2012/0068771 A1 | * | 3/2012 | Carroll .................... H03F 3/195 |
| | | | 330/291 |
| 2012/0087282 A1 | | 4/2012 | Shibahara |
| 2012/0139641 A1 | * | 6/2012 | Kaczman ............... H03F 1/0222 |
| | | | 330/295 |
| 2012/0154054 A1 | | 6/2012 | Kaczman |
| 2013/0029619 A1 | | 1/2013 | Zhang et al. |
| 2013/0084816 A1 | | 4/2013 | Gomez et al. |
| 2013/0116017 A1 | | 5/2013 | Zhang et al. |
| 2013/0130752 A1 | | 5/2013 | Zhang et al. |
| 2013/0223565 A1 | * | 8/2013 | McCallister ...... H04L 25/03343 |
| | | | 375/297 |
| 2013/0265107 A1 | | 10/2013 | Holmes |
| 2015/0009980 A1 | | 1/2015 | Zhang et al. |
| 2015/0171799 A1 | | 6/2015 | Zhang et al. |
| 2015/0207578 A1 | | 7/2015 | Ramamurthy et al. |
| 2015/0295548 A1 | | 10/2015 | Zhang et al. |
| 2016/0079940 A1 | | 3/2016 | Zhang et al. |

FOREIGN PATENT DOCUMENTS

| | | |
|---|---|---|
| CN | 101505178 A | 8/2009 |
| CN | 101981810 A | 2/2011 |
| CN | 102217138 A | 10/2011 |
| CN | 103988424 A | 8/2014 |
| CN | 104011998 A | 8/2014 |
| GB | 2510084 | 7/2014 |
| WO | WO 2010/134858 | 11/2010 |
| WO | WO 2011-001769 | 1/2011 |
| WO | WO 2013/009640 | 1/2013 |
| WO | WO 2013/067031 | 5/2013 |
| WO | WO 2013/071152 | 5/2013 |

OTHER PUBLICATIONS

Bischof et al, "SiGe-Power Amplifiers in Flipchip and Packaged Technology," IEEE Radio Frequency Circuits Symposium, 2001, pp. 35-38.

Tombak et al, "A Flip-Chip Silicon IPMOS Power Amplifier and a DC/DC Converter for GSM 850/900/1800/1900 MHz Systems," IEEE Radio Frequency Circuits Symposium, 2007, pp. 79-82.

Xu, "1-8-GHz GaN-Based Power Amplifier Using Flip-Chip Bonding," IEEE Microwave and Guided Wave Letters, Jul. 1999, pp. 277-279, vol. 9, No. 7.

International Search Report and Written Opinion in PCT Application No. PCT/US2012/064509, dated Mar. 11, 2013 in 11 pages.

Collinson, Glenn, et al., "Effects of Harmonic Terminations on Power and Efficiency of GAAS HBT Power Amplifiers at 900MHZ", IEE Colloquium on Solid-State Power Amplifiers, Dec. 16, 1991, pp. 12/1-12/5.

Kim, Bumman, et al. 'Envelope Tracking Technique for Multimode PA Operation', In: Proceedings of the 39th European Microwave Conference, Sep. 29-Oct. 1, 2009, pp. 429-432.

Kang, Jongchan, et al. 'A Highly Linear and Efficient Differential CMOS Power Amplifier With Harmonic Control', In: IEEE Journal of Solid-State Circuits, vol. 41, No. 6, Jun. 2006, pp. 1314-1322.

(56) References Cited

OTHER PUBLICATIONS

Spirito, M., et al., "Experimental Procedure to Optimize Out-of-Band Terminations for Highly Linear and Power Efficient Bipolar Class-AB RF Amplifiers", IEEE BCTM 7.3, 2005, pp. 112-115.

Woo, Young Yun, et al. 'Analysis and Experiments for High-Efficiency Class-F and Inverse Class-F Power Amplifiers', In: IEEE Transactions on Microwave Theory and Techniques, vol. 54, No. 5, May 2006, pp. 1969-1974.

Lee, et al., "A High-Linearity Wideband Power Amplifier With Cascaded Third-Order Analog Predistorters," IEEE Microwave and Wireless Components Letters, vol. 20, No. 2, pp. 112-114, Feb. 2010.

Cripps, Steve C., "RF Power Amplifiers for Wireless Communications," $2^{nd}$ ed., Artech House 2006.

\* cited by examiner

FLIP-CHIP AMPLIFIER WITH TERMINATION CIRCUIT

CROSS-REFERENCE TO RELATED APPLICATIONS

This application is a continuation of U.S. patent application Ser. No. 13/673,612 filed Nov. 9, 2012 and titled "FLIP-CHIP LINEAR POWER AMPLIFIER WITH HIGH POWER ADDED EFFICIENCY," which claims priority to U.S. Provisional Application No. 61/558,866 filed Nov. 11, 2011 and titled "FLIP-CHIP LINEAR POWER AMPLIFIER WITH HIGH POWER ADDED EFFICIENCY," the disclosures of each of which are expressly incorporated by reference herein in their entireties.

BACKGROUND

Field

The present disclosure generally relates to flip-chip devices having radio-frequency power amplifier with high power added efficiency.

Description of the Related Art

Flip-chip is a common term for a device having a semiconductor chip that is interconnected to a mounting pad by, for example, solder bumps. The chip is typically flipped so that the integrated circuit side faces the mounting pad. Such a configuration can provide advantageous features such as compact size and absence of wirebond interconnections.

Radio-frequency (RF) power amplifier (PA) is a wireless component that can be implemented in a flip-chip configuration. Among others, desirable features of such a PA typically include power added efficiency (PAE) and linearity. A higher PAE can provide, for example, a longer battery life in a wireless device such as a mobile phone. In some situations, enhancing the PAE can adversely impact linearity. Similarly, improving linearity can cause a decrease in PAE.

SUMMARY

In some implementations, the present disclosure relates to a flip-chip apparatus that includes a radio-frequency (RF) signal path having a node driven by at least one circuit element formed on a flip-chip die. The apparatus further includes a first termination circuit configured to match an impedance of a fundamental frequency of a signal at the node. The apparatus further includes a second termination circuit separate from the first termination circuit. The second termination circuit is configured to terminate at a phase corresponding to a harmonic frequency of the signal at the node.

In some embodiments, the at least one circuit element can include a power amplifier, the node can be connected to either or both of an output of the power amplifier and an input of the power amplifier. In some embodiments, the harmonic frequency can include a second harmonic frequency of the signal. In some embodiments, the apparatus can further include a fundamental load line that includes the first termination circuit.

In some embodiments, at least a portion of the first termination circuit and at least a portion of the second termination circuit can be implemented on a flip-chip packaging substrate. the signal path can be implemented on the flip-chip die in communication with the flip-chip packaging substrate. The signal path can be coupled to at least one of the first termination circuit and the second termination circuit via one or more conductor traces formed on the flip-chip packaging substrate. The signal path can be coupled to the first termination circuit via at least one conductor trace and coupled to the second termination circuit via at least one conductor trace. A different number of conductor traces can couple the signal path to the first termination circuit than to the second termination circuit.

In some embodiments, the packaging substrate can include a laminate substrate. In some embodiments, the first termination circuit can include a capacitor embodied on the packaging substrate.

In some embodiments, the apparatus can further include a third termination circuit separate from both the first termination circuit and the second termination circuit. The third termination circuit can be configured terminate at a phase corresponding to another harmonic frequency of the signal at the node.

In some embodiments, the at least one circuit element can include a gallium arsenide bipolar transistor. A collector of the gallium arsenide bipolar transistor can be configured to drive the node.

In some embodiments, the first termination circuit can include a first inductive circuit element and a first capacitive circuit element. The second termination circuit can include a second inductive circuit element and a second capacitive circuit element. The first capacitive circuit element can have a capacitance that is different than a capacitance of the second capacitive circuit element. The first inductive circuit element can have an inductance that is different than an inductance of the second inductive circuit element. The inductance of the first inductive circuit element can be different than the inductance of the second inductive circuit element due to a different number of conductor traces coupling the node to the first termination circuit than the number of conductor traces coupling the node to the second termination circuit. the conductor traces can couple the node to the first termination circuit in parallel.

In some embodiments, the node can be included in a path between a first power amplifier stage and a second power amplifier stage.

In accordance with a number of implementations, the present disclosure relates to a multi-chip module that includes a flip-chip power amplifier die having one or more power amplifiers configured to amplify an input signal and to generate an amplified output signal. The multi-chip module further includes an output matching network having a first termination circuit configured to match an impedance of a fundamental frequency of the amplified output signal, and a second termination circuit separate from the first termination circuit, with the second termination circuit being configured to terminate at a phase corresponding to a harmonic frequency of the amplified output signal.

In some embodiments, the flip-chip power amplifier die can include a GaAs device and at least a portion of the output matching network can be implemented on a flip-chip packaging substrate separate from the flip-chip power amplifier die. In some embodiments, the multi-chip module can be configured to be mounted on a mobile phone board. In some embodiments, the output matching network can be configured to extend an amount of time for a battery of a mobile device to discharge. In some embodiments, the output matching network can be configured to increase signal strength of the amplified output signal. In some embodiments, the output matching network can be configured to reduce heat loss in the multi-chip module. In some embodiments, the output matching network can be configured to reduce an amount of energy of the amplified output signal converted to energy corresponding to a harmonic frequency component of the amplified output signal. In some embodiments, the output matching network can be configured to convert energy corresponding to a harmonic frequency component of the amplified output to energy corresponding to a fundamental frequency component of the amplified output signal.

In a number of implementations, the present disclosure relates to a mobile device that includes a battery configured to power the mobile device, a flip-chip power amplifier die configured to amplify a radio frequency (RF) input signal and to generate an amplified RF signal, and an antenna configured to transmit the amplified RF signal. The mobile device further includes an output matching network having a first termination circuit configured to match an impedance of a fundamental frequency of the amplified RF signal, and a second termination circuit separate from the first termination circuit, with the second termination circuit being configured to terminate at a phase corresponding to a harmonic frequency of the amplified RF signal so as to extend an amount of time for the battery to discharge.

In some embodiments, the mobile device can be configured to communicate using at least one of a 3G communications standard and a 4G communications standard. In some embodiments, the mobile device can be configured as a smart phone. In some embodiments, the mobile device can be configured as a tablet computer.

In some embodiments, the first termination circuit can include a conductor trace in a path between an output of the power amplifier and the antenna. In some embodiments, the second termination circuit can include a conductor trace in a path between an output of the power amplifier and a ground reference voltage. In some embodiments, the at least one circuit element of the first termination circuit can include a first capacitor mounted on a flip-chip packaging substrate.

In accordance with some implementations, the present disclosure relates to an electronic system that includes a power amplifier configured to amplify a radio frequency (RF) input signal and to generate an amplified RF output signal. The system further includes an antenna configured to transmit the amplified RF signal. The system further includes an output matching network having a first termination circuit configured to match an impedance of a fundamental frequency of the amplified RF output signal, and a second termination circuit separate from the first termination circuit, with the second termination circuit being configured to terminate at a phase corresponding to a harmonic frequency of the amplified RF output signal.

In some embodiments, at least a portion of the first termination circuit can be embodied on a flip-chip packaging substrate. In some embodiments, the system can be configured as a base station. In some embodiments, the system can be configured as a femtocell.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

Figure 1A:
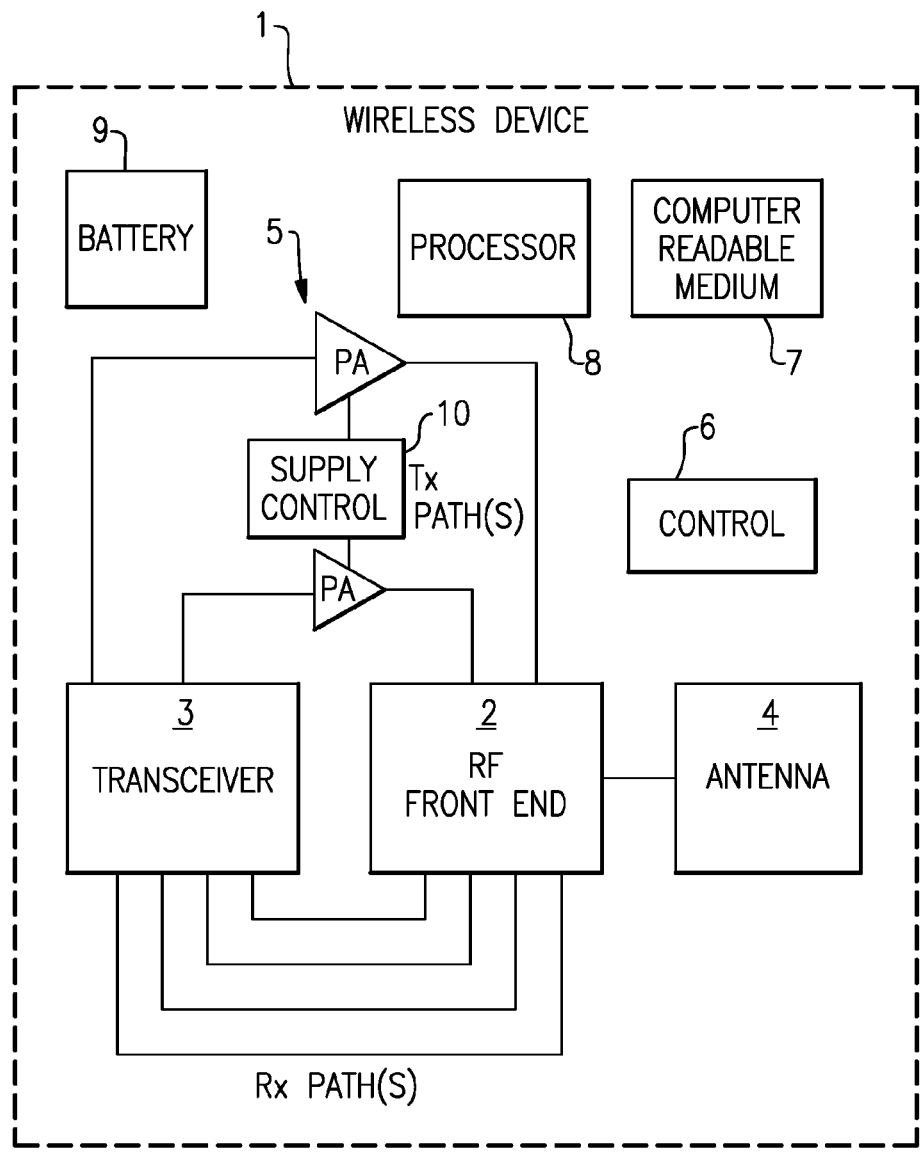
FIG. 1A is a schematic block diagram of an illustrative wireless device.

In some implementations, the present disclosure relates to circuits configured to prevent or reduce reflection of a signal, such as termination circuits. More specifically, some implementations relate to separate termination circuits configured to prevent or reduce portions of the power of different frequency components of a signal from being reflected. Using the systems, apparatus, and methods described herein, electronic systems, such as systems that include a power amplifier and/or systems configured to transmit radio frequency (RF) signals, can operate more efficiently and/or consume less power. For instance, less energy can be converted to harmonic frequencies of an RF signal and/or energy from harmonic frequency components of an RF signal can be converted into energy at a fundamental frequency of the RF signal.

Power added efficiency (PAE) is a metric for rating power amplifiers. In addition, linearity is another metric for rating power amplifiers. PAE and/or linearity can be metrics by which customers determine which power amplifiers to purchase. For instance, power amplifiers with a PAE below a certain level may not be purchased by a customer due to the impact of PAE on a customer product. A lower PAE can, for example, reduce the battery life of an electronic device, such as a mobile phone. However, enhancing PAE can come at the cost of reducing linearity. Similarly, increasing linearity can cause a decrease in PAE.

A load line at an output of a power amplifier can impact PAE and linearity. The load line at the power amplifier output can be configured to increase and/or optimize linearity and/or PAE. This can include matching fundamental frequency components and/or harmonic frequency components of the power amplifier output. Such matching can be implemented by termination circuits.

A signal at a node in a power amplifier system can include a fundamental frequency component and one or more harmonic frequency components. Some conventional power amplifier systems have a single termination circuit, e.g., a load line, to match an impedance of a fundamental frequency of the signal at the node and terminate at a phase corresponding to a harmonic frequency of the signal at the node. However, it can be difficult to tune the single termination circuit to both match an impedance of the fundamental frequency of an amplified power amplifier output signal and terminate at a phase of a harmonic frequency of the amplified power amplifier output signal in a way that optimizes both PAE and linearity. As a result, PAE can decrease due to optimizing either matching an impedance of the fundamental frequency of amplified power amplifier output or terminating the amplified power amplifier output at a phase of the harmonic frequency.

As described herein, an electronic system can include two or more separate termination circuits each coupled to a node in a signal path. A first termination circuit can be configured to match an impedance of a fundamental frequency of a signal at a node. In some implementations, the first termination circuit can be included in a fundamental load line. A second termination circuit, separate from the first termination circuit, can be configured to terminate at a phase corresponding to a harmonic frequency of the signal at the node. Circuit elements of the first termination circuit and the second termination circuit can be selected so as to increase PAE and/or linearity in a power amplifier system.

In some implementations, at least a portion of the first termination circuit and/or the second termination circuit can be embodied separate from the power amplifier die. For example, in the context of wirebond-connection implementation, the first termination circuit can include one or more wirebonds electrically connected to one or more pins of a power amplifier die and one or more capacitances (e.g., capacitors) separate from the power amplifier die and mounted on a packaging substrate. Alternatively or additionally, the second termination circuit can include one or more wirebonds electrically connected to one or more pins of the power amplifier die and one or more capacitances (e.g., capacitors) separate from the power amplifier die and mounted on a packaging substrate. In at least one of the first termination circuit and the second termination circuit, the one or more wirebonds can function as an inductive circuit element and be coupled in series with the one or more capacitors mounted on the packaging substrate. By using two or more separate termination circuits, each termination circuit can be tuned to prevent reflection of the signal at a desired frequency. For instance, the inductance and/or capacitance of each termination circuit can be selected such that each termination circuit prevents reflect of a desired frequency component of a signal.

In another example, in the context of flip-chip implementation, the first termination circuit can include one or more conductor traces formed on a packaging substrate such as a laminate. Such conductor traces can be electrically connected to one or more connection bumps of a flip-chip power amplifier die and one or more capacitances (e.g., capacitors) separate from the power amplifier die and mounted on the packaging substrate. Alternatively or additionally, the second termination circuit can include one or more conductor traces formed on the packaging substrate. Similarly, such conductor traces can be electrically connected to one or more connection bumps of the power amplifier die and one or more capacitances (e.g., capacitors) separate from the power amplifier die and mounted on the packaging substrate. In at least one of the first termination circuit and the second termination circuit, the one or more conductor traces can function as an inductive circuit element and be coupled in series with the one or more capacitors mounted on the packaging substrate. By using two or more separate termination circuits, each termination circuit can be tuned to prevent reflection of the signal at a desired frequency. For instance, the inductance and/or capacitance of each termination circuit can be selected such that each termination circuit prevents reflect of a desired frequency component of a signal.

The methods, systems, and apparatus for signal path termination described herein may be able to achieve one or more of the following advantageous features, among others. Advantageously, the separate termination circuits configured to prevent reflection of two or more distinct frequency components of a signal can increase one or more of PAE, linearity of a power amplifier, and baseband performance (for example, a broader frequency response and/or greater bandwidth). In some implementations, both PAE and linearity of the power amplifier can be increased. Furthermore, the figure of merit (FOM) of a power amplifier can also be increased. Moreover, battery life can be extended, an amount of heat dissipated can be reduced, signal quality of the signal upon which the separate termination circuits are preventing reflection can be increased, or any combination thereof.

The headings provided herein are for convenience only and do not necessarily affect the scope or meaning of the claimed invention.

Wireless Devices

Any of the systems, methods, apparatus, and computer-readable media for preventing reflection of two or more frequency components of a signal described herein can be implemented in a variety of electronic devices, such as a wireless device, which can also be referred to as a mobile device. FIG. 1A schematically depicts a wireless device 1. Examples of the wireless device 1 include, but are not limited to, a cellular phone (e.g., a smart phone), a laptop, a tablet computer, a personal digital assistant (PDA), an electronic book reader, and a portable digital media player. For instance, the wireless device 1 can be a multi-band and/or multi-mode device such as a multi-band/multi-mode mobile phone configured to communicate using, for example, Global System for Mobile (GSM), code division multiple access (CDMA), 3G, 4G, long term evolution (LTE), the like, or any combination thereof.

In some embodiments, the wireless device 1 can include one or more of a RF front end 2, a transceiver component 3, an antenna 4, power amplifiers 5, a control component 6, a computer readable medium 7, a processor 8, a battery 9, and supply control block 10, or any combination thereof.

The transceiver component 3 can generate RF signals for transmission via the antenna 4. Furthermore, the transceiver component 3 can receive and process incoming RF signals from the antenna 4.

It will be understood that various functionalities associated with the transmission and receiving of RF signals can be achieved by one or more components that are collectively represented in FIG. 1 as the transceiver 3. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 1 as the antenna 4. For example, a single antenna can be configured to provide both transmitting and receiving functionalities. In another example, transmitting and receiving functionalities can be provided by separate antennas. In yet another example, different bands associated with the wireless device 1 can be provided with different antennas.

In FIG. 1, one or more output signals from the transceiver 3 are depicted as being provided to the antenna 4 via one or more transmission paths. In the example shown, different transmission paths can represent output paths associated with different bands and/or different power outputs. For instance, the two example power amplifiers 5 shown can represent amplifications associated with different power output configurations (e.g., low power output and high power output), and/or amplifications associated with different bands. In some implementations, one or more termination circuits can be included in one or more of the transmission paths.

In FIG. 1, one or more detected signals from the antenna 4 are depicted as being provided to the transceiver 3 via one or more receiving paths. In the example shown, different receiving paths can represent paths associated with different bands. For example, the four example paths shown can represent quad-band capability that some wireless devices are provided with.

To facilitate switching between receive and transmit paths, the RF front end 2 can be configured to electrically connect the antenna 4 to a selected transmit or receive path. Thus, the RF front end 2 can provide a number of switching functionalities associated with an operation of the wireless device 1. In certain embodiments, the RF front end 2 can include a number of switches configured to provide functionalities associated with, for example, switching between different bands, switching between different power modes, switching between transmission and receiving modes, or some combination thereof. The RF front end 2 can also be configured to provide additional functionality, including filtering of signals. For example, the RF front end 2 can include one or more duplexers. Moreover, in some implementations, the RF front end 2 can include one or more termination circuits configured to prevent reflection of a frequency component of a signal.

The wireless device 1 can include one or more power amplifiers 5. RF power amplifiers can be used to boost the power of an RF signal having relatively low power. Thereafter, the boosted RF signal can be used for a variety of purposes, including driving the antenna of a transmitter. Power amplifiers 5 can be included in electronic devices, such as mobile phones, to amplify a RF signal for transmission. For example, in mobile phones having an architecture for communicating under the 3G and/or 4G communications standards, a power amplifier can be used to amplify a RF signal. It can be desirable to manage the amplification of the RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot. A power amplifier module can include one or more power amplifiers.

FIG. 1 shows that in certain embodiments, a control component 6 can be provided, and such a component can be configured to provide various control functionalities associated with operations of the RF front end 2, the power amplifiers 5, the supply control 10, and/or other operating component(s). Non-limiting examples of the supply control 10 are described herein in greater detail.

In certain embodiments, a processor 8 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 7 that can direct a computer or other programmable data processing apparatus to operate in a particular manner, such that the instructions stored in the computer-readable memory produce an article of manufacture including instructions which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide operations for implementing the acts specified in a flowchart and/or block diagram block or blocks.

The illustrated wireless device 1 also includes the supply control block 10, which can be used to provide a power supply to one or more of the power amplifiers 5. For example, the supply control block 10 can be a DC-to-DC converter. However, in certain embodiments the supply control block 10 can include other blocks, such as, for example, an envelope tracker configured to vary the supply voltage provided to the power amplifiers 5 based upon an envelope of the RF signal to be amplified.

The supply control block 10 can be electrically connected to the battery 9, and the supply control block 10 can be configured to vary the voltage provided to the power amplifiers 5 based on an output voltage of a DC-DC converter. The battery 9 can be any suitable battery for use in the wireless device 1, including, for example, a lithium-ion battery. By reducing reflection of an output signal of the power amplifiers 5, the power consumption of the battery 9 can be reduced, thereby improving performance of the wireless device 1.

Multi-Chip Modules

Figure 1B:
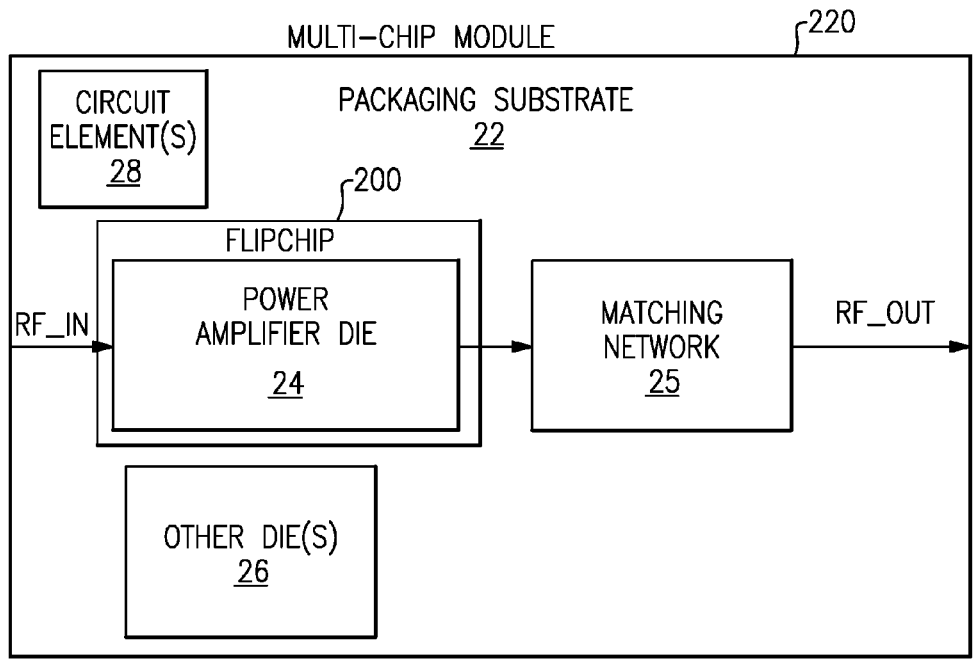
FIG. 1B is a schematic block diagram of an illustrative multi-chip module.

FIG. 1B is a schematic block diagram of a multi-chip module (MCM) 220. The MCM 220 can be referred to as a power amplifier module. The MCM 220 can include a packaging substrate 22, a power amplifier die 24 implemented as a flip-chip configuration 200, a matching network 25, one or more other dies 26, and one or more circuit elements 28 mounted on the packaging substrate 22. The one or more other dies 26 can include, for example, a controller die, which can include a power amplifier bias circuit and/or a direct current-to-direct current (DC-DC) converter. Example circuit element(s) 28 mounted on the packaging substrate 22 can include, for example, inductor(s), capacitor(s), impedance matching network(s), the like, or any combination thereof. The multi-module 220 can include a plurality of dies and/or other components mounted on the packaging substrate 22 of the MCM 220. In some implementations, the substrate 22 can be a multi-layer substrate such as a laminate configured to support the dies and/or components and to provide electrical connectivity to external circuitry when the MCM 220 is mounted on a circuit board, such as a phone board.

The power amplifier die 24 can receive a RF signal at an input pin of the MCM 220. The power amplifier die 24 can include one or more power amplifiers, including, for example, multi-stage power amplifiers configured to amplify the RF signal. The amplified RF signal can be provided to an output bump of the power amplifier die 24. The matching network 25 can be provided on the MCM 220 to aid in reducing signal reflections and/or other signal distortions. The matching network 25 can include one or more termination circuits that implement any combination of features described herein. The power amplifier die 24 can be any suitable die. In some implementations, the power amplifier die is a gallium arsenide (GaAs) die. In some of these implementations, the GaAs die has transistors formed using a heterojunction bipolar transistor (HBT) process.

The MCM 220 can also include a $V_{CC}$ pin, which can be electrically connected to, for example, the power amplifier die 24. The MCM 220 can include circuit element(s) 28, such as inductor(s), which can be formed, for example, by trace on the multi-chip module. The inductor(s) can operate as a choke inductor, and can be disposed between the supply voltage and the power amplifier die. In some implementations, the inductor(s) can be surface mounted. Additionally, the circuit element(s) 28 can include capacitor(s) electrically connected in parallel with the inductor(s) and configured to resonate at a frequency near the frequency of a signal received on the pin RF_IN. In some implementations, the capacitor(s) can include a surface mounted capacitor.

In the example MCM 220 implemented in flip-chip configuration, the matching network 25 can include one or more termination circuits. In some implementations, the matching network 25 can include conductor traces configured for electrically connecting input and/or output connection bumps of the power amplifier die 24 to the packaging substrate 22. The conductor traces can function as inductors. The inductance can be increased by adding additional conductor traces in parallel. Similarly the inductance can be decreased by removing parallel conductor traces and/or adding conductor traces in series. The matching network 25 can also include one or more capacitors mounted on the packaging substrate 22. Each termination circuit can include capacitor(s) in series with one or more conductor traces electrically connected to one or more bumps of the power amplifier die 24. The capacitance and/or inductance values can be selected so as to prevent certain frequency components from being reflected (for example, from an antenna) due to impedance mismatches. This can advantageously increase one or more of PAE, power amplifier linearity, bandwidth over which the power amplifier operates within a specification, FOM, the like, or any combination thereof. Termination circuits that can be included in the matching network 25 will be described in more detail herein.

The MCM 220 can be modified to include more or fewer components, including, for example, additional power amplifier dies, capacitors and/or inductors. For instance, the MCM 220 can include one or more additional matching networks 25. In particular there can be another matching network between RF_IN and an input to the power amplifier die 24 and/or an additional matching network between power amplifier stages. As another example, the MCM 220 can include an additional power amplifier die, as well as an additional capacitor and inductor configured to operate as a parallel LC circuit disposed between the additional power amplifier die and the $V_{CC}$ pin of the module. The MCM 220 can be configured to have additional pins, such as in implementations in which a separate power supply is provided to an input stage disposed on the power amplifier die and/or implementations in which the multi-chip module operates over a plurality of bands.

Electronic Systems

Figure 1C:
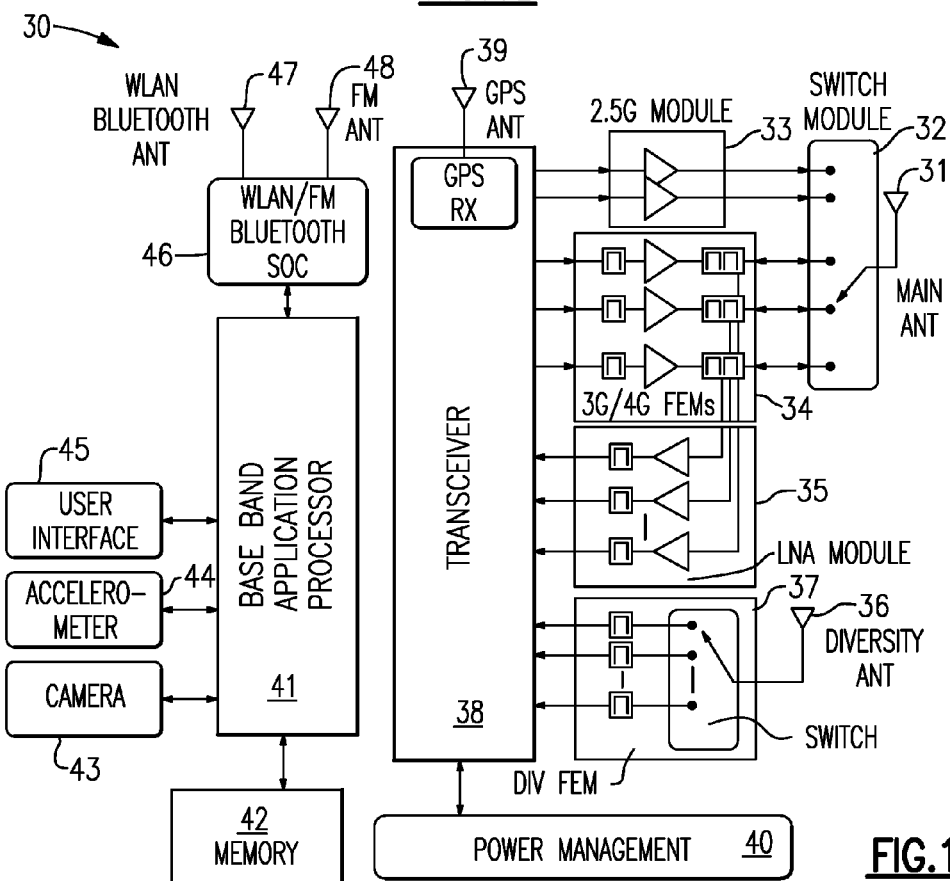
FIG. 1C is a schematic block diagram of an illustrative electronic system.

FIG. 1C is a schematic block diagram of an another illustrative wireless system 30, which can implement one or more features of this disclosure. In some embodiments, the illustrative wireless system 30 of FIG. 1C can be implemented in a mobile phone. Any combination of features of the termination circuits described herein can be implemented in connection with power amplifiers, for example, in the 2.5G module and/or the 3G/4G front end modules (FEMs) of the wireless system 30.

The illustrated wireless system 30 includes a main antenna 31, a switch module 32, a 2.5 G module 33, a 3G/4G front end module 34, an LNA module 35, a diversity antenna 36, a diversity front end module 37, a transceiver 38, a global positioning system (GPS)_antenna 39, a power management controller 40, a base band application processor 41, a memory 42, a user interface 43, an accelerometer 44, a camera 45, a WLAN/FM Bluetooth System on a Chip (SOC) 46, a WLAN Bluetooth antenna 47, and an FM antenna 48. It will be understood that the wireless system 30 can include more or fewer components than illustrated in FIG. 1C.

The transceiver 38 can be a multi-mode transceiver. The transceiver 38 can be used to generate and process RF signals using a variety of communication standards, including, for example, Global System for Mobile Communications (GSM), Code Division Multiple Access (CDMA), wideband CDMA (W-CDMA), Enhanced Data Rates for GSM Evolution (EDGE), other proprietary and non-proprietary communications standards, or any combination thereof. As illustrated, the transceiver 38 is electrically coupled to the 2.5G Module 33 and the 3G/4G front end module 34. A power amplifier in the 2.5G Module 33 and the 3G/4G front end module 34 can boost the power of an RF signal having a relatively low power. Thereafter, the boosted RF signal can be used to drive the main antenna 31. Such power amplifiers can include any of the termination circuits described herein to reduce reflection and/or noise at an input and/or an output. The switch module 32 can selectively electrically couple power amplifiers in the 2.5G Module 33 and the 3G/4G front end module 34 to the main antenna 31. The switch module 32 can electrically connect the main antenna 31 to a desired transmit path.

In some implementations, the diversity front-end module 37 and the diversity antenna 36 can help improve the quality and/or reliability of a wireless link by reducing line-of-sight losses and/or mitigating the impacts of phase shifts, time delays and/or distortions associated with signal interference of the main antenna 31. In some embodiments, a plurality of diversity front-end modules and diversity antennas can be provided to further improve diversity.

The wireless system 30 can include the WLAN/FM Bluetooth SOC module 46, which can generate and process received WLAN Bluetooth and/or FM signals. For example, the WLAN/FM Bluetooth SOC module 46 can be used to connect to a Bluetooth device, such as a wireless headset, and/or to communicate over the Internet using a wireless access point or hotspot via the WLAN Bluetooth antenna 47 and/or the FM antenna 48.

The wireless system 30 can also include a baseband application processor 41 to process base band signals. A camera 43, an accelerometer 44, a user interface 45, the like, or any combination thereof can communicate with the baseband application processor 41. Data processed by the baseband application processor can be stored in the memory 42.

Although termination circuits have been illustrated and described in the context of two examples of wireless devices, the termination circuits described herein can be used in other wireless devices and electronics.

Termination Circuits

As used herein, a termination circuit can refer to a circuit configured to prevent a portion of the power of a signal, such as an RF signal, from being reflected. A termination circuit can be configured to reduce and/or minimize reflections of the signal by matching impedance. This can increase PAE and/or power amplifier gain.

Figure 2:
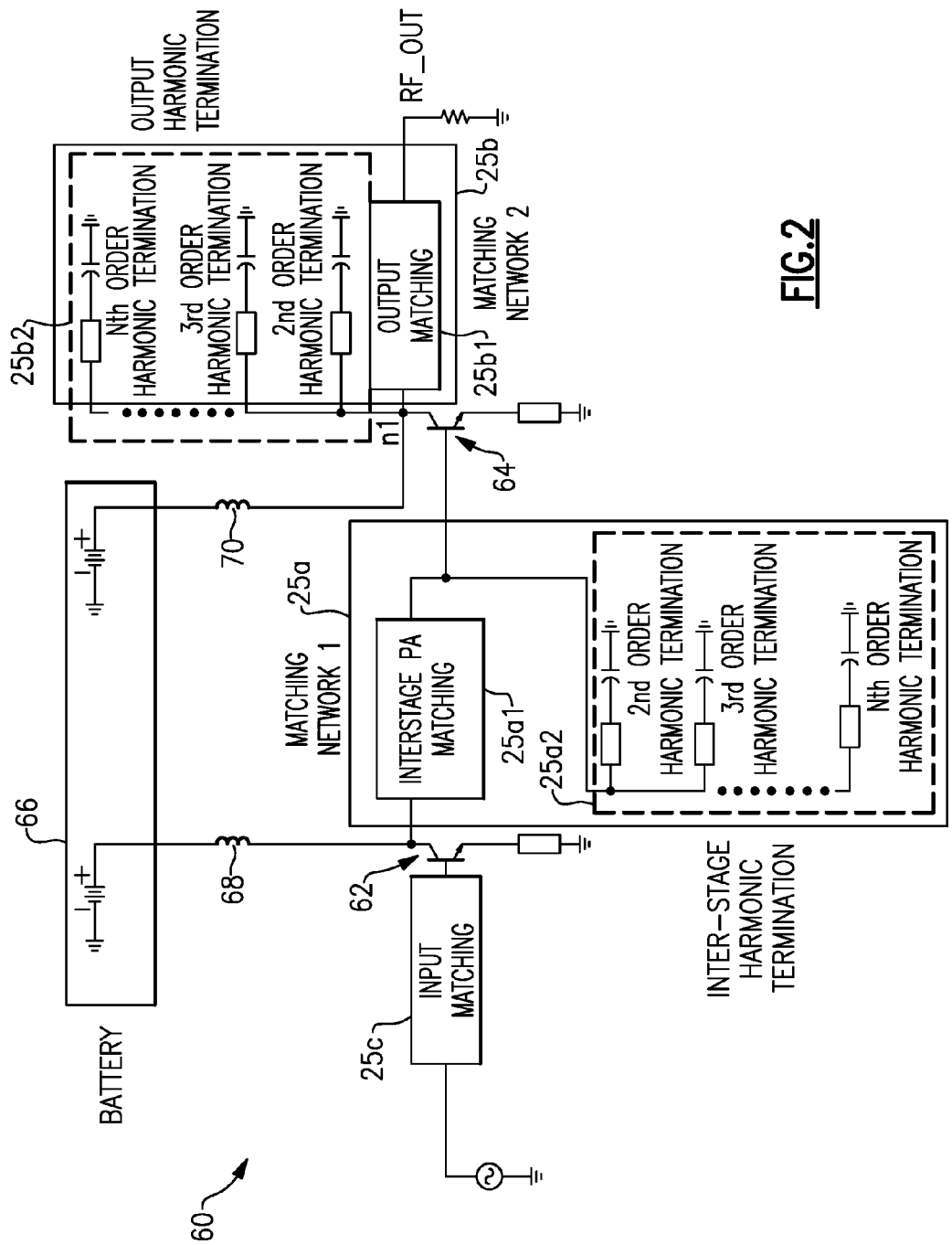
FIG. 2 is a circuit diagram illustrating a power amplifier system with example termination circuits according to an embodiment.

With reference to FIG. 2, a circuit diagram of a power amplifier system 60 with example termination circuits will be described. The power amplifier system 60 can include one or more of power amplifier stages 62 and/or 64 such as GaAs bipolar transistors, a power supply such as a battery 66, inductors 68 and/or 70, and matching networks 25a, 25b, and/or 25c. An RF input signal RF_IN can be provided to a first stage power amplifier 62 via an input matching network 25c. A first stage amplified RF signal can be generated by the first stage power amplifier 62. The first stage amplified RF signal can be provided to the second stage power amplifier 64 via an inter stage power amplifier matching network 25a1. A second stage amplified RF signal can be generated by the second stage power amplifier 64. The second stage amplified RF signal can be provided to an output load via an output matching network 25b1. The RF signal RF_OUT provided to the output load can be provided to an output of a power amplifier die in some implementations.

The first stage power amplifier 62 can be coupled to the power supply, for example, the battery 66, via the choke inductor 68. Similarly, the second stage amplifier 64 can be coupled to the power supply, for example, the battery 66, via the choke inductor 70. The first power amplifier stage 62 can consume less power from the power supply when corresponding termination circuits are tuned to prevent reflections of a fundamental frequency component of the first stage amplified RF signal and one or more harmonic components of the first stage amplified RF signal. Similarly, the second power amplifier stage 64 can consume less power from the power supply when corresponding termination circuits are tuned to prevent reflections of a fundamental frequency component of the second stage amplified RF signal and one or more harmonic components of the second stage amplified RF signal.

As illustrated in FIG. 2, the power amplifier system 60 can include a first matching network 25a and a second matching network 25b. The first matching network 25a can include the inter stage fundamental termination circuit 25a1 and an inter stage harmonic termination circuit 25a2. The second matching network 25b can include the output fundamental termination circuit 25b1 and an output harmonic termination circuit 25b2. Any combination of features of second matching network 25b can be applied to the first matching network 25a, as appropriate.

For illustrative purposes, the second matching network 25b will be described in more detail. The output fundamental termination circuit 25b1 can be a fundamental load line. The output fundamental termination circuit 25b1 can be configured to prevent a portion of the power of a fundamental frequency component of the second stage amplified RF signal from being reflected from the output load. The output harmonic termination circuit 25b2 can be configured to prevent a portion of the power of one or more harmonic frequency components of the second stage amplified RF signal from being reflected from the load. More specifically, the output harmonic termination circuit 25b2 can include a termination circuit configured to prevent a portion of the power a second order harmonic frequency component of the second stage amplified RF signal from being reflected from the load. In some implementations, the output harmonic termination circuit 25b2 can alternatively or additionally include a termination circuit configured to prevent a portion of the power a third order harmonic frequency component of the second stage amplified RF signal from being reflected from the load. The principles and advantages of separate termination circuits configured to prevent reflection of a portion of the power a harmonic frequency component of the second stage amplified RF can be applied to any desired harmonic frequency component and/or any number of harmonic frequency components.

A termination circuit corresponding to a desired frequency component of the second stage amplified RF signal can include one or more inductive circuit elements in series with one or more capacitive circuit elements. The series circuit elements of the termination circuit can couple an input node of a fundamental load line, such as the output fundamental termination circuit 25b1, and a ground reference voltage. An effective inductance of the inductive circuit element(s) and/or an effective capacitance of the capacitive circuit element(s) can be selected so as to tune the termination circuit to prevent reflections of the desired frequency component of the second stage amplified RF signal.

The foregoing examples of termination circuits described in reference to FIG. 2 can yield desirable performance results. Additional details concerning implementations of such termination circuits and improved performance can be found in U.S. patent application Ser. No. 13/543,472, titled "SIGNAL PATH TERMINATION," which is incorporated by reference herein in its entirety.

In some embodiments, a flip-chip (FC) implemented power amplifier (PA) module can yield significantly better performance for the PA than a comparable wirebond (WB) based module, even if the termination circuit is not separated into a fundamental termination circuit and one or more harmonic termination circuits. To compare such wirebond module and flip-chip module performance features, FIG. 3 shows an example wirebond-based power amplifier system configuration 160, and FIG. 4 shows an example flip-chip-based power amplifier system configuration 260.

Figure 3:
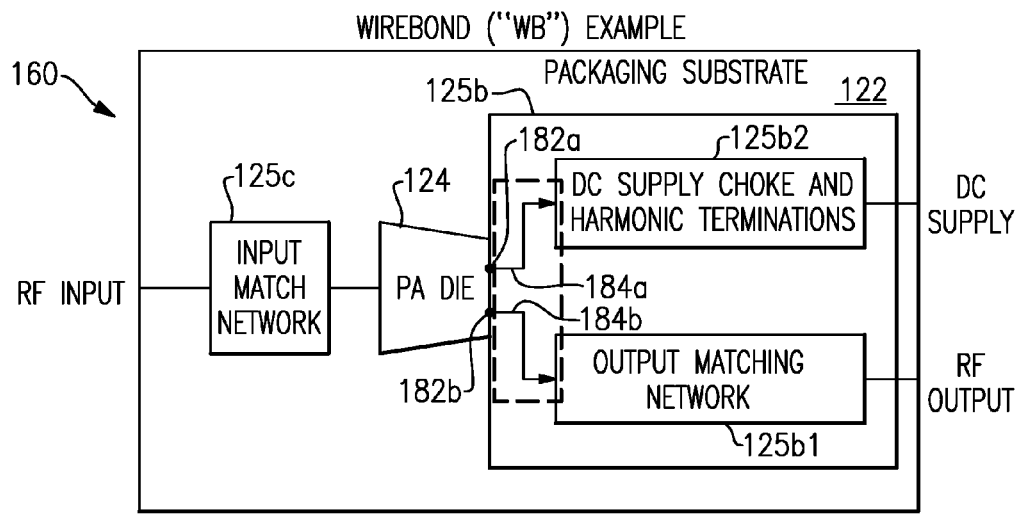
FIG. 3 is a block diagram illustrating example termination circuits implemented in a wirebond configuration.
Figure 4:
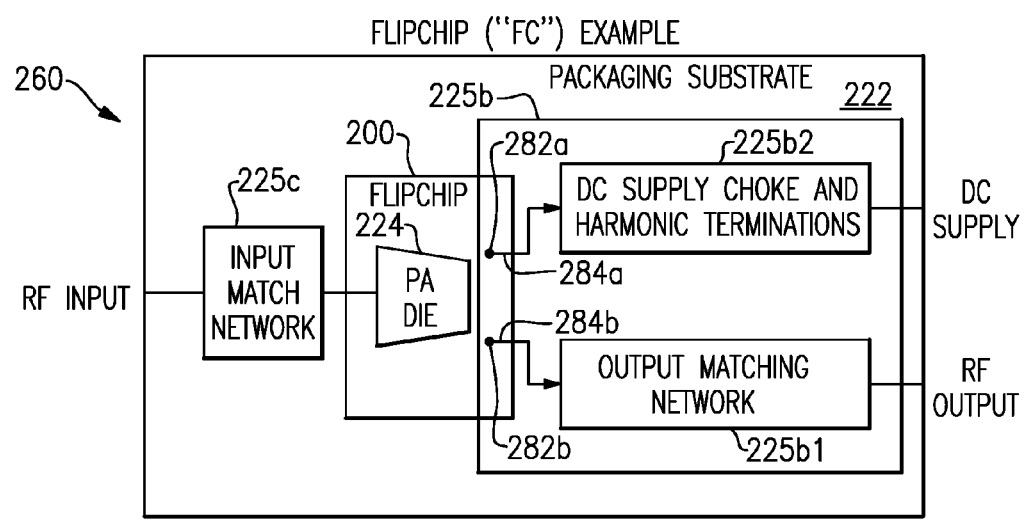
FIG. 4 is a block diagram illustrating example termination circuits implemented in a flip-chip configuration.

Referring to FIG. 3, the power amplifier system 160 can include a power amplifier die 124 mounted on a packaging substrate 122. The power amplifier die 124 can include pins, such as output pins 182a and 182b. An output of a power amplifier on the die 124 can be provided to the output pins 182a and 182b. The output pins 182a and 182b can correspond to a node that is coupled to, for example, a collector of a GaAs bipolar transistor. The output pins 182a and 182b can correspond to an input to a matching network 125b via wirebonds 184a and 184b. The matching network 125b is depicted as having an output matching network portion 125b1 and a harmonic termination portion 125b2.

In the example power amplifier system 160 of FIG. 3, the output fundamental termination portion 125b1 is electrically coupled to the harmonic termination portion 125b2. The fundamental termination portion 125b1 can include one or more wirebonds 184b coupling one or more output pins 182b to a wire trace of the packaging substrate 122. The harmonic termination portion 125b2 can include one or more wirebonds 184a coupling one or more output pins 182a to a wire trace of the packaging substrate 122 that is connected to the wire trace associated with the fundamental termination portion 125b1.

In the example power amplifier system 160 of FIG. 3, the fundamental termination portion 125b1 is depicted as being connected to an RF output pin of the PA system 160. Similarly, the harmonic termination portion 125b2 is depicted as being connected to a DC supply pin of the PA system 160.

Referring to FIG. 4, the power amplifier system 260 can include a power amplifier die 224 mounted on a packaging substrate 222. The power amplifier die 224 can include bump connections, such as output bumps 282a and 282b. An output of a power amplifier on the die 224 can be provided to the output bumps 282a and 282b. The output bumps 282a and 282b can correspond to a node that is coupled to, for example, a collector of a GaAs bipolar transistor. The output bumps 282a and 282b can correspond to an input to a matching network 225b via conductor traces 284a and 284b. The matching network 225b is depicted as having an output matching network portion 225b1 and a harmonic termination portion 225b2.

In the example power amplifier system 260 of FIG. 4, the output fundamental termination portion 225b1 is electrically coupled to the harmonic termination portion 225b2. The fundamental termination portion 225b1 can include one or more conductor traces 284b coupling one or more output bumps 282b to a conductor trace of the packaging substrate 222. The harmonic termination portion 225b2 can include one or more conductor traces 284a coupling one or more output bumps 282a to a conductor trace of the packaging substrate 222 that is connected to the conductor trace associated with the fundamental termination portion 225b1.

In the example power amplifier system 260 of FIG. 4, the fundamental termination portion 225b1 is depicted as being connected to an RF output pin of the PA system 260. Similarly, the harmonic termination portion 225b2 is depicted as being connected to a DC supply pin of the PA system 260.

FIGS. 5A-5G show comparisons of some example performance parameters for a power amplifier when implemented in wirebond (WB) configuration (e.g., FIG. 3) and flip-chip configuration (e.g., FIG. 4). For the flip-chip configuration, two examples (FC1 and FC2) differ in their inter-stage termination circuits.

Figure 5A:
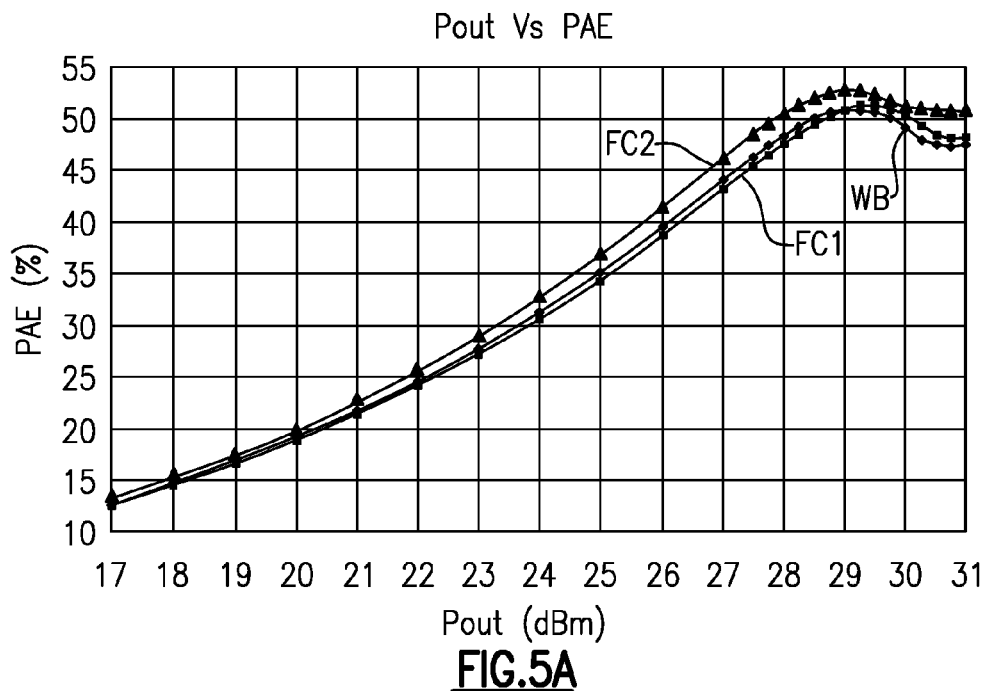
FIGS. 5A-5G show comparisons of various performance parameters associated with the wirebond and flip-chip configurations of FIGS. 3 and 4.

FIG. 5A shows plots of power added efficiency (PAE, in %) as a function of power output (Pout) of the example power amplifier, expressed in dBm (power ratio in dB of measured power referenced to one milliwatt). The plots show that FC1 and WB cases yield similar performance, while FC2 yield a consistently higher PAE performance through the power output range shown.

Figure 5B:
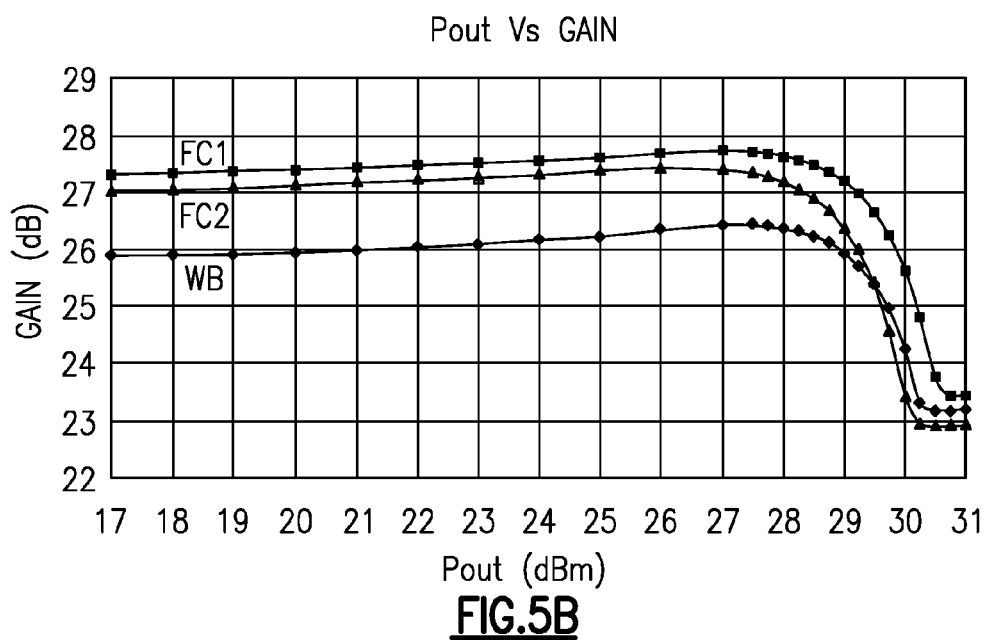

FIG. 5B shows plots of gain (in dB) as a function of power output (Pout) of the example power amplifier (in dBm). The plots show that both FC1 and FC2 cases yield higher gains than the WB case.

Figure 5C:
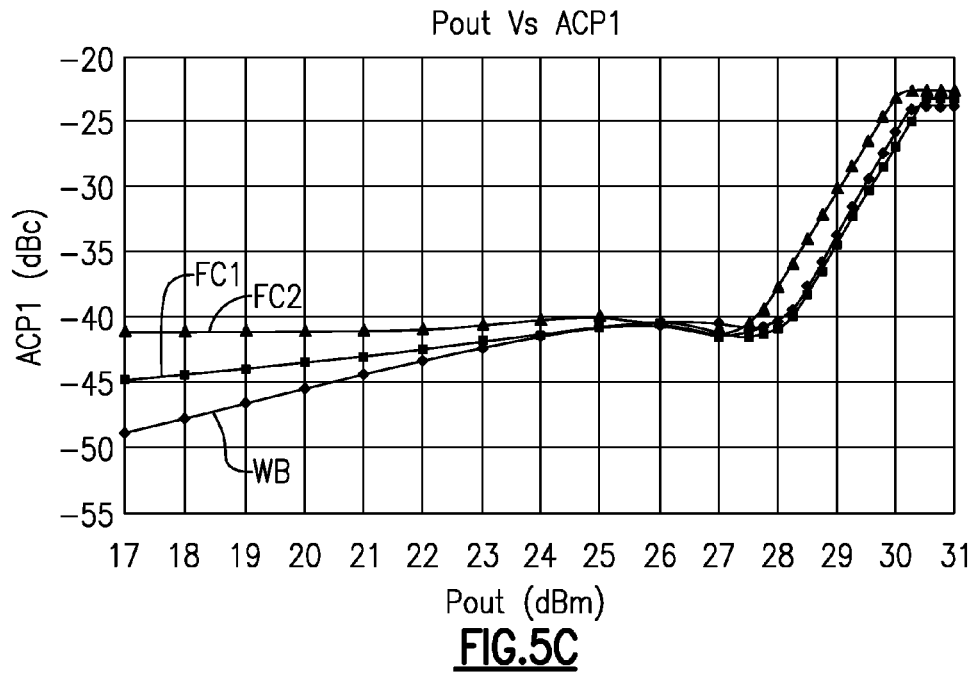

FIG. 5C shows plots of ACP (adjacent channel power) (in dBc, power ratio of signal relative to a carrier signal) as a function of power output (Pout) of the example power amplifier (in dBm). The plots show that FC 1 case has higher ACP than the WB case when Pout is between 17 and 23 dBm, but merge into similar performance at higher Pout values. The FC2 case is shown to yield generally higher ACP values than the WB case, with the exception of Pout range in 26 dBm to 27 dBm.

Figure 5D:
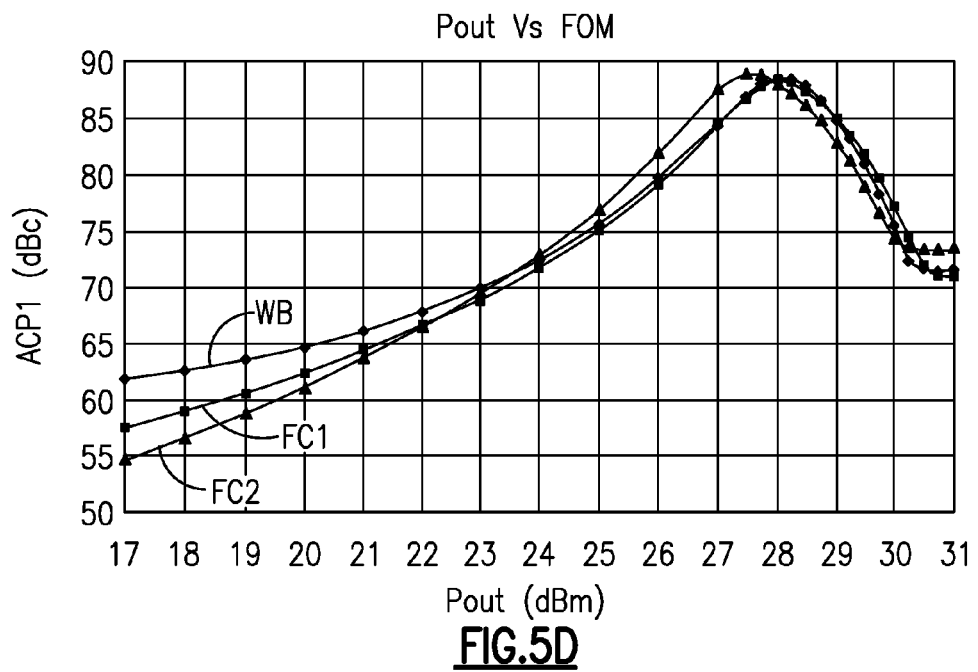

FIG. 5D shows plots of FOM (figure of merit) as a function of power output (Pout) of the example power amplifier (in dBm). The plots show that FC1 case has lower FOM than the WB case when Pout is between 17 and 23 dBm, but merge into similar performance at higher Pout values. The FC2 case is shown to be also lower than the WB case when Pout is between 17 and 23 dBm, and between 28 and 30 dBm; but higher in other ranges (23 to 28 dBm and 30 to 31 dBm).

Figure 5E:
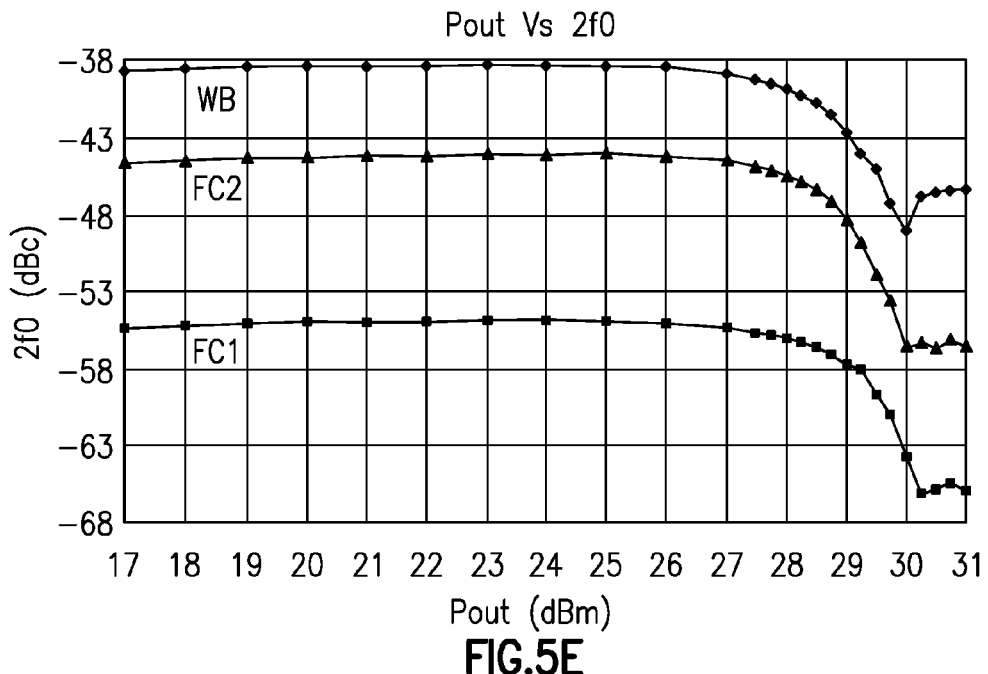

FIG. 5E shows plots of second harmonic response (in dBc) as a function of power output (Pout) of the example power amplifier (in dBm). The plots show that both FC1 and FC2 cases have significantly lower second harmonic amplitudes than the WB case throughout the Pout range.

Figure 5F:
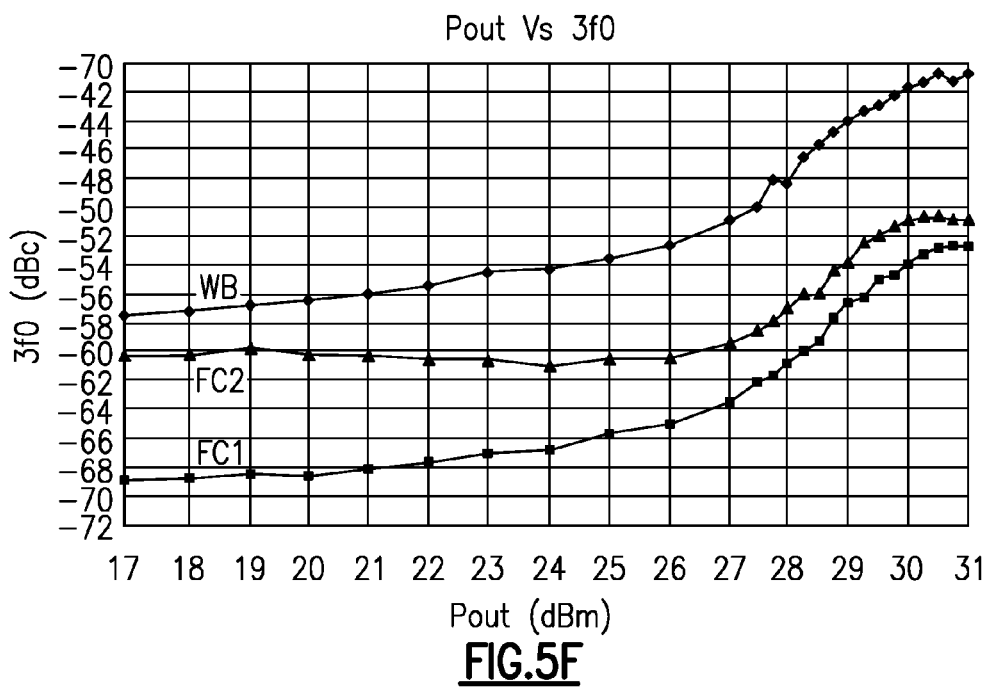

FIG. 5F shows plots of third harmonic response (in dBc) as a function of power output (Pout) of the example power amplifier (in dBm). The plots show that both FC1 and FC2 cases have significantly lower third harmonic amplitudes than the WB case throughout the Pout range.

Figure 5G:
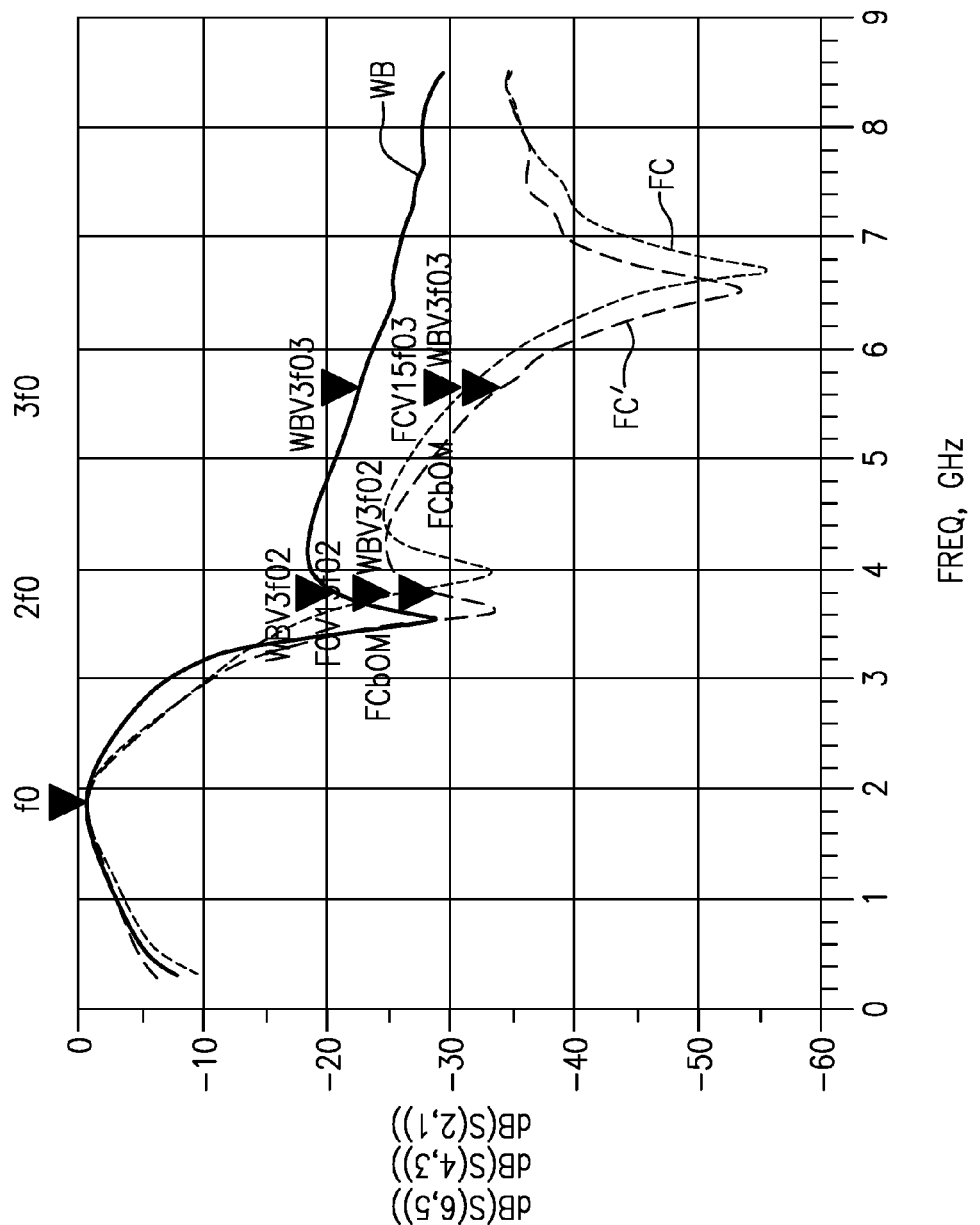

FIG. 5G shows plots of insertion loss (in dB) as a function of frequency of signal being processed by the example power amplifier. The plots show that both FC and FC' cases have lower insertion losses at second and third harmonics than the WB case. For the third harmonic, the insertion losses of the FC and FC' cases are significantly lower than that of the WB case.

Figure 6:
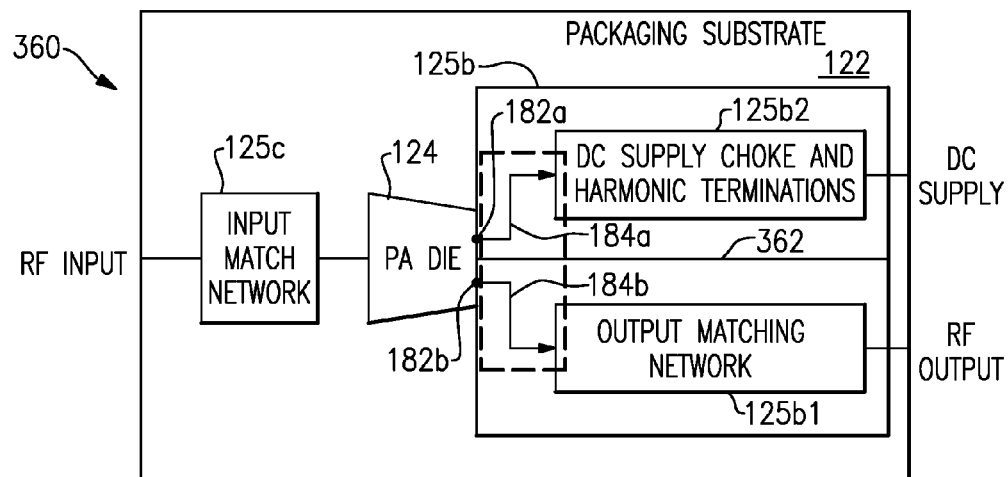
FIG. 6 shows that in some embodiments, the termination circuits of FIG. 3 can be separated so as to better handle termination of fundamental frequency and one or more harmonic frequencies.

FIG. 6 shows an example wirebond configuration 360 where a matching network 125b can include an output matching network portion 125b1 that is separate (depicted by line 362) from a harmonic termination portion 125b2. Other components (e.g., input match network 125c and PA die 124) can be similar to those described in reference to FIG. 3.

In implementations with more than one output pin 182a, the wirebonds 184a electrically connecting the pins 182a to a wire trace on a substrate 122 can be coupled in parallel. The number of wirebonds 184a included in the output harmonic termination circuit 125b2 can configured separately from the number of wirebonds 184b of the output fundamental termination circuit 125b1. In this way, inductance of different termination circuits can be tuned to increase linearity and/or PAE of the power amplifier system 360. This can include matching an impedance of a fundamental frequency of a signal at the node in the output fundamental termination circuit 125b1 and terminating at a phase corresponding to a harmonic frequency of the signal at the node in the output harmonic termination circuit 125b2. Alternatively or additionally, effective capacitances of the different termination circuits can also be configured separately and independent of each other. For example, a wire trace can couple wirebonds in series with one or more capacitive circuit elements, such as capacitors, in the output matching network illustrated in FIG. 6. An effective capacitance of the termination circuit can be selected so as to prevent or reduce reflection of a desired frequency component of a signal on the signal path at the output pin(s) 182a that is different from the desired frequency component of the signal that the output fundamental termination circuit 125b1 is configured to prevent or reduce from reflecting. The effective inductance and the effective capacitance of the termination circuit can be configured in combination with each other so as to increase linearity and/or PAE of the power amplifier system 360.

Figure 7:
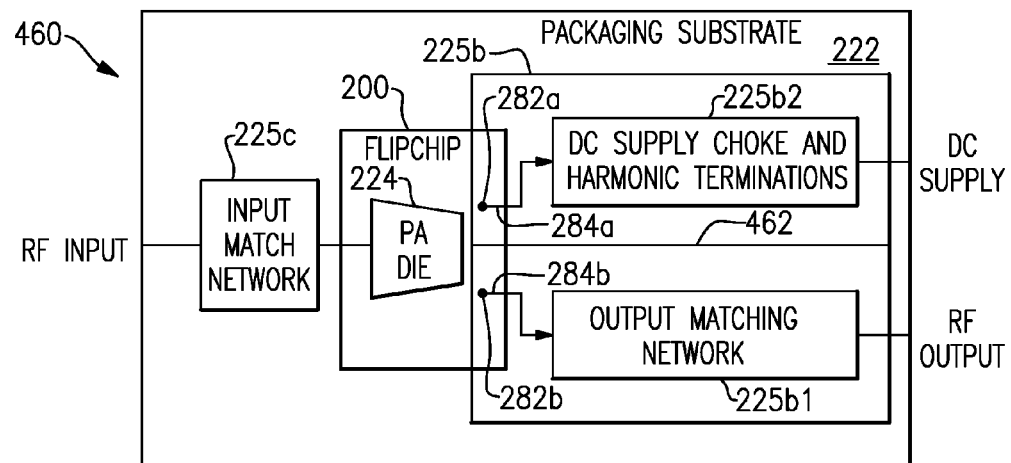
FIG. 7 shows that in some embodiments, the termination circuits of FIG. 4 can be separated so as to better handle termination of fundamental frequency and one or more harmonic frequencies.

FIG. 7 shows an example flip-chip configuration 460 where a matching network 225b can include an output matching network portion 225b that is separate (depicted by line 462) from a harmonic termination portion 225b2. Other components (e.g., input match network 225c and PA die 224) can be similar to those described in reference to FIG. 4.

In implementations with more than one output bump 282a, the conductor traces 284a electrically connecting the bumps 282a to a wire trace on a substrate 222 can be coupled in parallel. The number of conductor traces 284a included in the output harmonic termination circuit 225b2 can configured separately from the number of conductor traces 284b of the output fundamental termination circuit 225b1. In this way, inductance of different termination circuits can be tuned to increase linearity and/or PAE of the power amplifier system 460. This can include matching an impedance of a fundamental frequency of a signal at the node in the output fundamental termination circuit 225b1 and terminating at a phase corresponding to a harmonic frequency of the signal at the node in the output harmonic termination circuit 225b2. Alternatively or additionally, effective capacitances of the different termination circuits can also be configured separately and independent of each other. For example, a wire trace can couple conductive traces in series with one or more capacitive circuit elements, such as capacitors, in the output matching network illustrated in FIG. 7. An effective capacitance of the termination circuit can be selected so as to prevent or reduce reflection of a desired frequency component of a signal on the signal path at the output bump(s) 282a that is different from the desired frequency component of the signal that the output fundamental termination circuit 225b1 is configured to prevent or reduce from reflecting. The effective inductance and the effective capacitance of the termination circuit can be configured in combination with each other so as to increase linearity and/or PAE of the power amplifier system 460.

Figure 8:
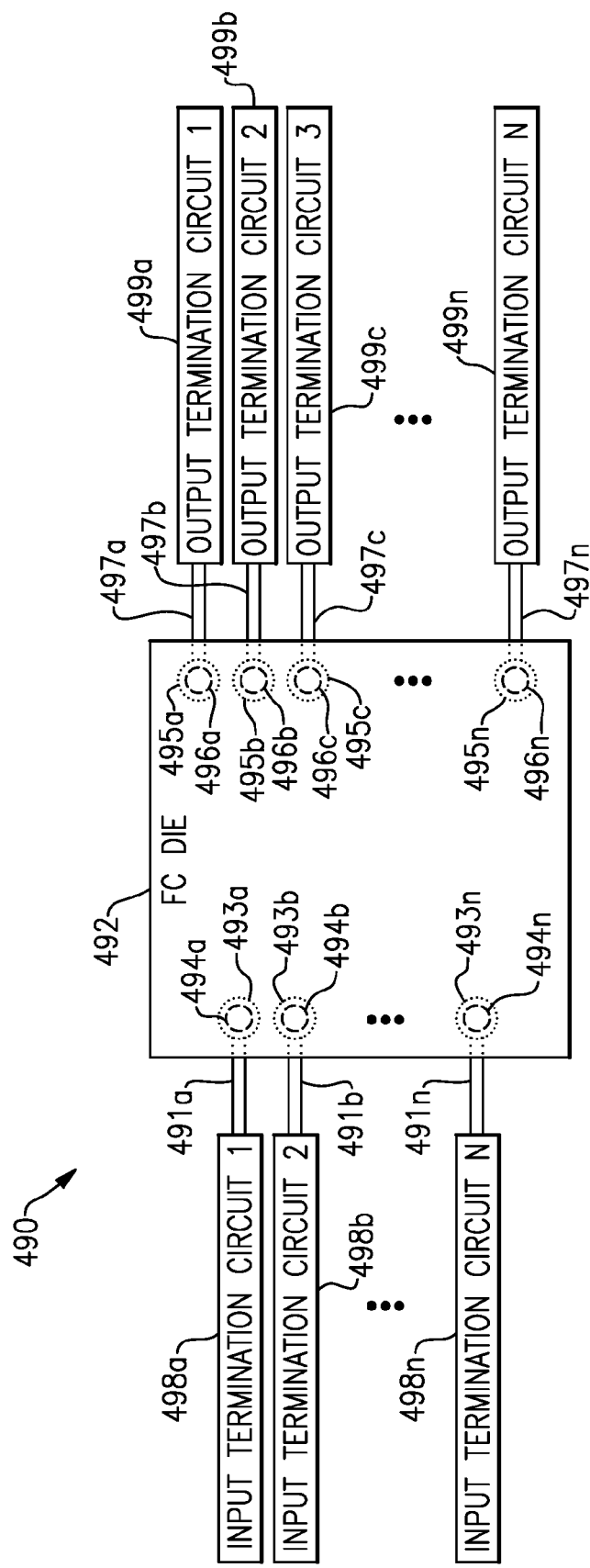
FIG. 8 shows that in some embodiments, the termination circuits of FIG. 7 can be separated into N separate circuits.

FIG. 8 shows that in some embodiments, any suitable number of separate termination circuits can be implemented based on a desired application. Moreover, FIG. 8 shows that a plurality of separate termination circuits can be implemented at a variety of nodes within an electronic system, such as an input of a die and/or output of a die. Although FIG. 8 shows a plurality of separate termination circuits at input and output locations on a die, any combination of features of separate termination circuits described herein can be applied to a signal at other nodes of an electronic system, including, for example, within a die such as a power amplifier die. Moreover, according to some implementations, one or more of the separate termination circuits coupled to a node can be embodied within a die and one or more of the separate termination circuits coupled to the node can be embodied outside the die.

As shown in FIG. 8, an electronic system 490 can include a flip-chip die 492 and a plurality of termination circuits. The electronic system 490 can be included, for example, in a wireless device of FIG. 1A, a multi-chip module of FIG. 1B, an electronic system of FIG. 1C, the like, or any combination thereof. In some implementations, the die 492 can be a flip-chip power amplifier die as described herein. In other implementations, the die 492 can include, for example, a frequency multiplier and/or a mixer.

The die 492 can include a plurality of input bumps 494a-494n and/or output bumps 496a-696n. Separate termination circuits that include any combination of features described herein can be coupled to different bumps. For instance, input termination circuits 498a-498n can each be configured to prevent or reduce reflection of a different frequency component of a signal at a node coupled to one or more input bumps of the die 492. Input termination circuits 498a-498n can be coupled to input bumps 494a-494n of the die 492, respectively, via bump pads 493a-493n and conductor traces 491a-491n formed on the packaging substrate. In some implementations, an input termination circuit can be coupled to two or more input bumps of the die 492. Alternatively or additionally, two or more input termination circuits can be coupled to a single bump of the die 492.

Similarly, output termination circuits 499a-499n can each be configured to prevent or reduce reflection of a different frequency component of a signal at a node that includes one or more output bumps. Output termination circuits 499a-499n can be coupled to output bumps 496a-496n of the die 492, respectively, via bump pads 495a-495n and conductor traces 497a-497n formed on the packaging substrate. In some implementations, an output termination circuit can be coupled to two or more output bumps of the die 492. Alternatively or additionally, two or more output termination circuits can be coupled to a single bump of the die 492.

Any suitable number of input bumps 494a-494n and/or output bumps 496a-496n can be included on the die 492. Moreover, any suitable number of input termination circuits 498a-498n and/or output termination circuits 499a-499n can be included in the electronic system 490. In some implementations, the number of separate input termination circuits 498a-498n and/or separate output termination circuits 499a-499n can be selected based on a desired number of harmonic frequency components to be reduced or substantially removed.

Figure 9:
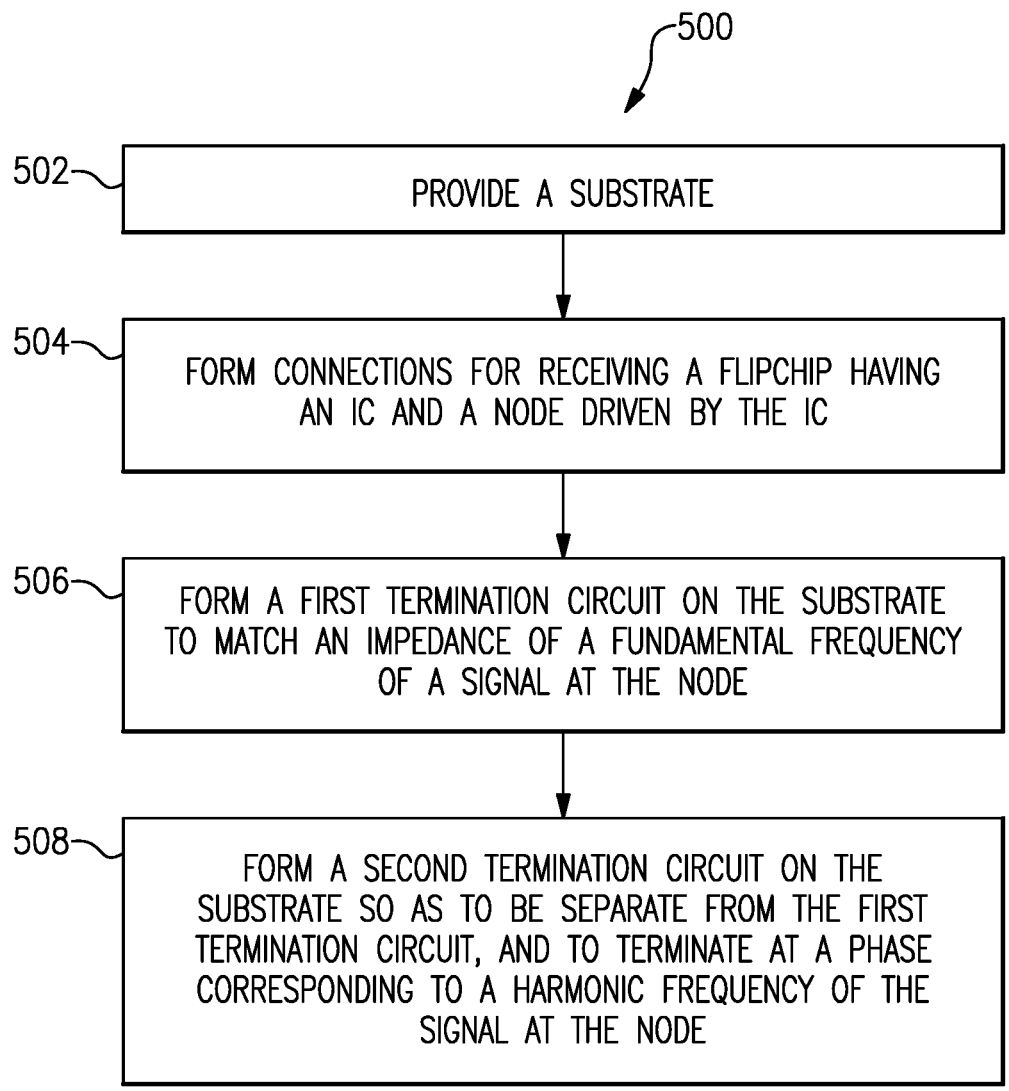
FIG. 9 shows a process that can be implemented to fabricate the termination circuits of FIG. 7.

FIG. 9 shows a process 500 that can be implemented to fabricate a termination circuit device having one or more features as described herein. In block 502, a substrate can be provided. Such a substrate can include a laminate such as a multi-chip module (MCM) laminate. In block 504, connections for receiving a flip-chip can be formed on the substrate. Such a flip-chip can include an integrated circuit (IC) and a node driven by the IC. In block 506, a first termination circuit can be formed on and/or in the substrate and configured to substantially match an impedance of a fundamental frequency of a signal at the node. In block 508, a second termination circuit can be formed on and/or in the substrate and configured so as to be separate from the first termination circuit. The second termination circuit can be further configured to substantially terminate at a phase corresponding to a harmonic frequency of the signal at the node.

In some embodiments, formations of the foregoing first and second termination circuits can be achieved during fabrication of the laminate, after such fabrication, or any combination thereof. For example, there may be electrical connections, such as inter-layer connections for or associated with the termination circuits, that can be formed during the laminate fabrication process. In another example, at least some of the conductor traces that are part of the termination circuits can be formed on the laminate surface near a flip-chip mounting location.

Applications

Some of the embodiments described above have provided examples in connection with electronic devices that include power amplifiers, such as mobile phones and base stations. However, the principles and advantages of the embodiments can be used for any other systems or apparatus that have needs for two or more separate termination circuits configured to prevent reflection of two or more different frequency components of a signal. For example, separate termination circuits can be implemented in connection with multipliers, such as frequency multipliers, and/or mixers instead of power amplifiers. As another example, separate termination circuits can be implemented at any point on a signal path at which it is desirable to separate termination circuits for two or more different frequency components, such as a fundamental frequency component and a harmonic frequency component.

Systems implementing one or more aspects of the present disclosure can be implemented in various electronic devices. Examples of electronic devices can include, but are not limited to, consumer electronic products, parts of the consumer electronic products, electronic test equipment, etc. More specifically, electronic devices configured implement one or more aspects of the present disclosure can include, but are not limited to, an RF transmitting device, any portable device having a power amplifier, a mobile phone (e.g., a smart phone), a telephone, a base station, a femtocell, a radar, a device configured to communication according to the WiFi standard, a television, a computer monitor, a computer, a hand-held computer, a tablet computer, a laptop computer, a personal digital assistant (PDA), a microwave, a refrigerator, an automobile, a stereo system, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Part of the consumer electronic products can include a multi-chip module, a power amplifier module, an integrated circuit including two or more termination circuits, a packaging substrate including one or more circuit elements, etc. Moreover, other examples of the electronic devices can also include, but are not limited to, memory chips, memory modules, circuits of optical networks or other communication networks, and disk driver circuits. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can." "could," "might." "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier module comprising:
a flip-chip power amplifier die including a power amplifier configured to amplify a radio frequency signal;
a first circuit element included in a matching network that is configured to provide impedance matching at a fundamental frequency of the radio frequency signal; and
a second circuit element included in a harmonic termination circuit, the second circuit element and the first circuit element being electrically connected to an output of the power amplifier by way of different bumps.

2. The power amplifier module of claim 1 further comprising an input termination circuit electrically connected to an input of the power amplifier.

3. The power amplifier module of claim 1 wherein the power amplifier is a multi-stage power amplifier.

4. The power amplifier module of claim 1 wherein the power amplifier includes a gallium arsenide bipolar transistor.

5. The power amplifier module of claim 1 wherein the flip-chip power amplifier die is mounted on a packaging substrate.

6. The power amplifier module of claim 5 wherein the second circuit element includes a capacitor on the packing substrate.

7. The power amplifier module of claim 6 further comprising a conductor trace coupled in series between the capacitor and a bump of the different bumps.

8. The power amplifier module of claim 5 wherein the different bumps are coupled to different respective bump pads on the packaging substrate.

9. The power amplifier module of claim 1 further comprising a first conductor trace coupled between the first circuit element and a first bump of the different bumps, and a second conductor trace coupled between the second circuit element and a second bump of the different bumps.

10. A flip-chip system comprising:
a flip-chip die including a radio frequency signal path configured to provide a radio frequency signal at a node;
a first circuit element electrically connected to the node by way of a first bump, the first circuit element being included in a matching network configured to provide impedance matching at a fundamental frequency of the radio frequency signal; and
a second circuit element electrically connected to the node by way of a second bump, the second circuit element being included in a harmonic termination circuit.

11. The flip-chip system of claim 10 wherein the harmonic termination circuit is configured to terminate at a phase corresponding to a second harmonic of the radio frequency signal.

12. The flip-chip system of claim 10 further comprising another harmonic termination circuit coupled to the node.

13. The flip-chip system of claim 10 wherein the radio frequency signal path includes a power amplifier having an output electrically connected to the node.

14. The flip-chip system of claim 10 wherein the flip-chip die is mounted on a laminate substrate.

15. The flip-chip system of claim 14 wherein the second circuit element includes a capacitor on the laminate substrate.

16. The flip-chip system of claim 15 further comprising a conductor trace coupled in series between the second bump and the capacitor.

17. The flip chip system of claim 10 wherein the flip-chip die is mounted on a packaging substrate, the first circuit element is coupled to the node by way of a first pad on the packaging substrate and the first bump, and the second circuit element is coupled to the node by way of a second pad on the packaging substrate and the second bump.

18. A method of fabricating termination circuits associated with a flip-chip die, the method comprising:
forming connections for receiving a flip-chip die on a substrate;
forming a first termination circuit on and/or in the substrate, the first termination circuit configured to providing impedance matching at a fundamental frequency of a radio frequency signal of the flip-chip die; and
forming a second termination circuit on and/or in the substrate, the second termination circuit configured to terminate at a phase corresponding to a harmonic frequency of the radio frequency signal of the flip-chip die, the second termination circuit being separate from the first termination circuit.

19. The method of claim 18 wherein the first termination includes a first conductor trace on the substrate, and the second termination circuit includes a second conductor trace on the substrate.

20. The method of claim 18 wherein the first termination includes a first capacitor on the substrate, and the second termination circuit includes a second capacitor on the substrate.

21. The method of claim 18 wherein forming the second termination circuit includes forming a conductor trace on the substrate and mounting a capacitor on the substrate.

* * * * *